(12) United States Patent
Carcasi et al.

(10) Patent No.: US 8,435,728 B2
(45) Date of Patent: May 7, 2013

(54) METHOD OF SLIMMING RADIATION-SENSITIVE MATERIAL LINES IN LITHOGRAPHIC APPLICATIONS

(75) Inventors: Michael A. Carcasi, Austin, TX (US); Benjamin M. Rathsack, Austin, TX (US); Mark H. Somervell, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 176 days.

(21) Appl. No.: 13/077,833

(22) Filed: Mar. 31, 2011

(65) Prior Publication Data
US 2011/0244403 A1    Oct. 6, 2011

Related U.S. Application Data

(63) Continuation-in-part of application No. 12/751,362, filed on Mar. 31, 2010.

(51) Int. Cl.
G03F 7/26    (2006.01)
(52) U.S. Cl.
USPC ............................ 430/322; 430/328; 430/330
(58) Field of Classification Search .................. 430/322, 430/331, 325, 328, 330, 326
See application file for complete search history.

(56) References Cited

U.S. PATENT DOCUMENTS

| | | | |
|---|---|---|---|
| 5,936,707 A | 8/1999 | Nguyen et al. | |
| 5,972,569 A | 10/1999 | Jeng et al. | |
| 6,740,473 B1 | 5/2004 | Lin et al. | |
| 7,364,839 B2 | 4/2008 | Hayasaki et al. | |
| 7,829,269 B1 | 11/2010 | Fonseca et al. | |
| 2004/0131980 A1 | 7/2004 | Hayasaki et al. | |
| 2004/0166448 A1 | 8/2004 | Chang et al. | |
| 2004/0214109 A1 | 10/2004 | Chen et al. | |
| 2004/0265745 A1 | 12/2004 | Sho et al. | |
| 2007/0003881 A1 | 1/2007 | Ito et al. | |
| 2008/0153301 A1 | 6/2008 | Tanaka et al. | |
| 2009/0023284 A1 | 1/2009 | Lin et al. | |
| 2009/0053649 A1 | 2/2009 | Nakashima et al. | |
| 2010/0055625 A1 | 3/2010 | Gronheid et al. | |

(Continued)

FOREIGN PATENT DOCUMENTS

EP    1939691 A2    7/2008
JP    01155337 A    6/1989

(Continued)

OTHER PUBLICATIONS

European Patent Office, International Search Report and Written Opinion issued in corresponding Application PCT/US2012/029905 mailed Jun. 28, 2012, 14 pp.

(Continued)

*Primary Examiner* — Kathleen Duda
*Assistant Examiner* — Caleen Sullivan
(74) *Attorney, Agent, or Firm* — Wood, Herron & Evans, LLP

(57) ABSTRACT

A method and system for patterning a substrate using a radiation-sensitive material is described. The method and system include forming a layer of radiation-sensitive material on a substrate, exposing the layer of radiation-sensitive material to a pattern of radiation, and then performing a post-exposure bake following the exposing. The imaged layer of radiation-sensitive material is then developed to remove either a region having high radiation exposure or a region having low radiation exposure to form radiation-sensitive material lines. An exposure gradient within the radiation-sensitive material lines is then removed, followed by slimming the radiation-sensitive material lines.

18 Claims, 10 Drawing Sheets

U.S. PATENT DOCUMENTS

| | | |
|---|---|---|
| 2010/0062380 A1 | 3/2010 | Takemura et al. |
| 2010/0068654 A1 | 3/2010 | Fonseca et al. |
| 2010/0239984 A1 | 9/2010 | Tsubaki |
| 2010/0273099 A1 | 10/2010 | Fonseca et al. |

FOREIGN PATENT DOCUMENTS

| | | |
|---|---|---|
| JP | 09251210 A | 9/1997 |
| WO | 2006056905 A2 | 6/2006 |
| WO | 2011123433 A2 | 10/2011 |

OTHER PUBLICATIONS

Kondo et al, The optimization of resist shrink process using track-based technology, Proceedings of SPIE, Mar. 29, 2010, 8 pp.

Iwao et al, Fabrication of 22-nm poly-silocn gate using resist shrink technology, Proceedings of SPIE, vol. 7273, 2009, 5 pp.

Thompson et al., Introduction to Microlithograhy, Second Edition, American Chemical Society, May 5, 1994, 1 pg.

European Patent Office, International Search Report and Written Opinion issued in corresponding International Patent Application No. PCT/US2011/030299, dated Feb. 7, 2012, 14 pp.

U.S. Patent and Trademark Office, Non-final Office Action issued in related U.S. Appl. No. 12/751,362, dated Mar. 22, 2012, 24 pp.

Sun et al., Wet Trimming Process for Critical Dimension Reduction, Brewer Science, Inc., Advances in Resist Materials Processing Technology XXV, 2008, vol. 6923, 11 pp.

Barron, Optical Issues in Photolithography, Connexions Module: m25448; Chemistry of Electronic Materials, version 1.4, Jul. 13, 2009, 5 pp.

Tsiartas, P. C. (1998). Dissolution Behavior of Phenolic Polymers Used in Positive-Tone Semiconductor Microlithography (Doctoral dissertation). Retrieved from Dissertations and Theses database. (UMI No. 9937151).

METHOD OF SLIMMING RADIATION-SENSITIVE MATERIAL LINES IN LITHOGRAPHIC APPLICATIONS

CROSS-REFERENCE TO RELATED APPLICATIONS

Pursuant to 37 C.F.R. §1.78(a), this application a continuation-in-part of co-pending non-provisional patent application Ser. No. 12/751,362, filed Mar. 31, 2010, which is expressly incorporated herein by reference.

FIELD OF THE INVENTION

The invention relates to methods of patterning a substrate. In particular, the invention relates to methods of decreasing line dimension (slimming) in radiation-sensitive materials.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Design rules define the space tolerance between devices or interconnect lines so as to ensure that the devices or lines do not interact with one another in any unwanted manner. One important layout design rule that tends to determine the overall size and density of the semiconductor device is the critical dimension (CD). A critical dimension of a circuit is defined as the smallest width of a line or the smallest space between two lines. Another critical design rule is minimum pitch, which is defined as the minimum width of a given feature plus the distance to the adjacent feature edge.

Photolithography is a standard technique utilized to manufacture semiconductor wafers by transferring geometric shapes and patterns on a mask to the surface of a semiconductor wafer. The basic photolithographic process includes projecting a patterned light source onto a layer of radiation-sensitive material, such as a photoresist layer, which is then followed by a development step.

To create finely detailed patterns with small critical dimensions and pitch requires projecting a clearly imaged light pattern. But the ability to project a clear image of a small feature onto the semiconductor wafer is limited by the wavelength of the light that is used, and the ability of a reduction lens system to capture enough diffraction orders from the illuminated mask. Current state-of-the-art photolithography tools use deep ultraviolet (DUV) light with wavelengths of 248 or 193 nm, which allow minimum feature sizes down to about 50 nm.

The minimum feature size that a projection system can print is given approximately by:

$$CD = k_1 \cdot \lambda / N_A$$

where CD is the minimum feature size or the critical dimension; $k_1$ is a coefficient that encapsulates process-related factors, and typically equals 0.4 for production; $\lambda$ is the wavelength of light used; and $N_A$ is the numerical aperture of the lens, as seen from the semiconductor wafer. According to this equation, minimum feature sizes can be decreased by decreasing the wavelength and/or by increasing the numerical aperture to achieve a tighter focused beam and a smaller spot size.

A photolithographic process utilizes an exposure tool to irradiate the layer of radiation-sensitive material on a wafer through a mask to transfer the pattern on the mask to the wafer. As the critical dimensions of the pattern layout approach the resolution limit of the lithography equipment, optical proximity effects (OPE) begin to influence the manner in which features on a mask transfer to the layer of radiation-sensitive material such that the mask and actual layout patterns begin to differ. Optical Proximity effects are known to result from optical diffraction in the projection system. The diffraction causes adjacent features to interact with one another in such a way as to produce pattern-dependent variations; the closer together features are, the more proximity effect is seen. Thus, the ability to locate line patterns close together encroaches on optical parameter limitations.

In accordance with the above description, new and improved methods for patterning semiconductor devices are therefore necessary, so as to accomplish the continued miniaturization of a circuit pattern formed on a semiconductor wafer. One non-optical approach is to narrow the line width of the radiation-sensitive material after the imaging, and the first developing are completed. Narrowing of line width is also known as "slimming" or "shrinking", those terms being used herein synonymously.

As discussed above, patterning of a semiconductor wafer generally involves coating a surface of the wafer (substrate) with a thin film or layer of a radiation-sensitive material, such as a photoresist, and then exposing the layer of radiation-sensitive material to a pattern of radiation by projecting radiation from a radiation source through a mask. Thereafter, a developing process is performed to remove various regions of the radiation-sensitive material. The specific region being removed is dependent upon the tone of the material and the developing chemistry. As an example, in the case of a positive-tone photoresist, the irradiated regions may be removed using a first developing chemistry and the non-irradiated regions may be removed using a second developing chemistry. Conversely, in the case of a negative-tone photoresist, the non-irradiated regions may be removed using a third developing chemistry and the irradiated regions may be removed using a fourth developing chemistry. The removed regions of photoresist expose the underlying wafer surface in a pattern that is ready to be etched into the underlying wafer surface.

As an example for positive-tone pattern development, a typical lithographic patterning technique is shown in FIGS. 1A and 1B. As an example for negative-tone pattern development, a typical lithographic patterning technique is shown in FIGS. 1A and 1C. As shown in FIG. 1A, a layer of radiation-sensitive material 102 is formed on a substrate 101. The layer of radiation-sensitive material 102 is exposed to electromagnetic (EM) radiation 107 through a mask 103. Reticle or mask 103 includes transparent regions 104 and opaque regions 108 that form a pattern, with a distance (or pitch) 109 being defined between opaque regions 108, as shown in FIG. 1A. The transparent regions 104 transmit EM radiation 107 to the layer of radiation-sensitive material 102, and the opaque regions 108 prevent EM radiation 107 from being transmitted to the layer radiation-sensitive material 102. As a result, the layer of radiation-sensitive material 102 has exposed regions 105 that are exposed to EM radiation 107 and unexposed regions 106 that are not exposed to EM radiation 107. As shown in FIG. 1A, opaque regions 108 are imaged onto the layer of radiation-sensitive material 102 to produce corresponding radiation-sensitive material features aligned with unexposed regions 106.

As shown in FIG. 1B, after removing exposed regions 105 of the layer of radiation-sensitive material 102 in FIG. 1A by a positive-tone developing process using an appropriate chemistry, unexposed regions 106 remain on substrate 101 and form the pattern transferred from mask 103. As shown in FIG. 1C, after removing unexposed regions 106 of the radiation-sensitive material 102 in FIG. 1A by a negative-tone developing process using an appropriate chemistry, exposed regions 105 remain on substrate 101, and thus form a complementary pattern to that shown in FIG. 1B. The regions remaining after removal of the exposed regions 105, or in the alternative, after removal of the unexposed regions 106, are referred to as radiation-sensitive material lines.

As shown in FIGS. 1A and 1B, opaque regions 108 are imaged onto the layer of radiation-sensitive material 102 to produce corresponding radiation-sensitive material features (i.e., unexposed regions 106). As shown in FIGS. 1A and 1B, pitch 110 between unexposed regions 106 is determined by pitch 109 between opaque regions 108 of mask 103. In this example, the pitch 110 of the patterned feature is approximately twice the width of the critical dimension 111 of the radiation-sensitive material lines. Thus, the critical dimension 111 is determined by the distance between opaque regions of mask 103 and the development process. To further reduce the critical dimension 111 of the radiation-sensitive material lines requires additional processing, as discussed next.

As shown in FIGS. 1A and 1C, transparent regions 104 are imaged onto the layer of radiation-sensitive material 102 to produce corresponding radiation-sensitive material features (i.e., exposed regions 105). As shown in FIGS. 1A and 1C, pitch 112 between exposed regions 105 is determined by pitch 109 between transparent regions 104 of mask 103. In this example, the pitch 112 of the patterned feature is approximately twice the width of the critical dimension 113 of the radiation-sensitive material lines. Thus, the critical dimension 113 is determined by the distance between transparent regions of mask 103 and the development process. To further reduce the critical dimension 113 of the radiation-sensitive material lines requires additional processing, as discussed next.

One typical method for reducing radiation-sensitive material line width involves plasma-based etching of the unexposed region 106 of the radiation-sensitive material after a positive-tone development conducted at nominal temperature. Plasma-based etching suffers from various issues such as process stability and higher front end costs. Other slimming or shrinking methods include wet methods, such as treating the unexposed region 106 with a positive-tone development-type chemistry at elevated temperatures. But wet developing methods may suffer from anisotropic slimming caused by or exacerbated by variations in the photolithographic image, as will be discussed further below.

Additional details of the photolithographic image are provided in FIG. 2. A layer of radiation-sensitive material 202 is formed on a substrate 201. The layer of radiation-sensitive material 202 is exposed to EM radiation 207 through a mask 203. Mask 203 includes transparent regions 204 and opaque regions 208 that form a pattern, as shown in FIG. 2. A distance (or pitch) 209 between opaque regions 208 is shown in FIG. 2. The transparent regions 204 transmit EM radiation 207 to the layer of positive-tone radiation-sensitive material 202, and the opaque regions 208 prevent EM radiation 207 from being transmitted to the layer of radiation-sensitive material 202.

While it would be desirable to produce only two types of image patterns, i.e., exposed and unexposed, FIG. 2 shows three regions of radiation-sensitive material 202 having different levels of exposure to EM radiation 107. Exposed regions 205 and unexposed regions 206 are separated by a partially exposed region 214, wherein an exposure gradient extends across the width of partially exposed region 214. This exposure gradient may be affected by various factors, such as the radiation-sensitive material thickness, the depth of focus and proximity effect. Thus, this exposure variation or gradient induces anisotropic slimming, which may produce weak points in the radiation-sensitive material lines.

In view thereof, new methods of slimming radiation-sensitive material lines that overcome the problems of the prior art are needed.

SUMMARY OF THE INVENTION

Embodiments of the invention provide a method of patterning a substrate, wherein the dimensions of radiation-sensitive material lines are decreased. The methods comprise forming a layer of radiation-sensitive material on a substrate; exposing the layer of radiation-sensitive material to a pattern of radiation, wherein the pattern includes: a first region having a high radiation exposure, a second region having a low radiation exposure, and a third region having an exposure gradient ranging from about said high radiation exposure to about said low radiation exposure. The methods further comprise performing a post-exposure bake following the exposing the layer of radiation-sensitive material to the pattern of radiation; performing positive-tone developing by contacting said layer of radiation-sensitive material with a first organic solvent-based composition to remove said first region from said substrate to provide a developed layer of radiation-sensitive material; removing the exposure gradient of the third region by transforming the second region and the third region to a fourth region having a substantially uniform level of radiation exposure, polarity or de-protection, or a combination thereof; and slimming the fourth region.

According to other embodiments of the present invention, the methods comprise forming a layer of radiation-sensitive material on a substrate; exposing the layer of radiation-sensitive material to a pattern of radiation, wherein the pattern includes: a first region having a high radiation exposure, a second region having a low radiation exposure, and a third region having an exposure gradient ranging from about said high radiation exposure to about said low radiation exposure. The methods further comprise performing a post-exposure bake following the exposing the layer of radiation-sensitive material to the pattern of radiation; performing negative-tone developing of the layer of radiation-sensitive material to remove the second region from the substrate; removing said exposure gradient of said third region by transforming said third region, and optionally said first region, to a fourth region formed from said first and said third regions having a substantially uniform level of radiation exposure, polarity, or de-protection, or a combination thereof; and slimming the fourth region.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention. In the accompanying drawings.

DETAILED DESCRIPTION OF THE DRAWINGS

A method and system for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Methods for patterning a substrate, including methods to reduce the critical dimension of a pattern that can be transferred onto a substrate for a given lithographic tool and mask, are described herein. Multiple chemical treatments are used to achieve an isotropic reduction in a critical dimension of a radiation-sensitive material line.

Figure 1A:
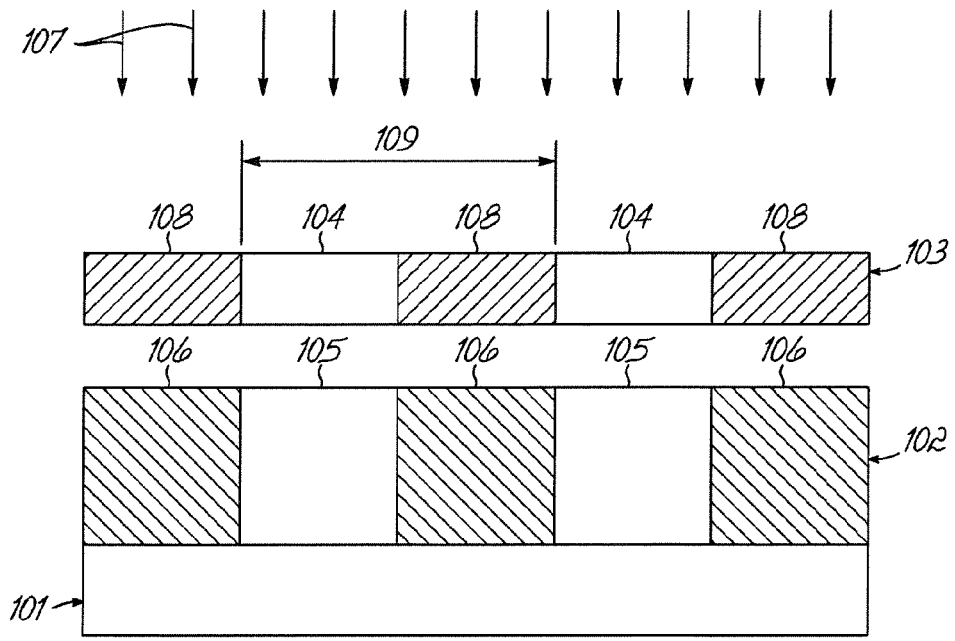
FIGS. 1A to 1C illustrate positive-tone and negative-tone lithographic patterning techniques utilizing a radiation-sensitive material according to the prior art.
Figure 1B:
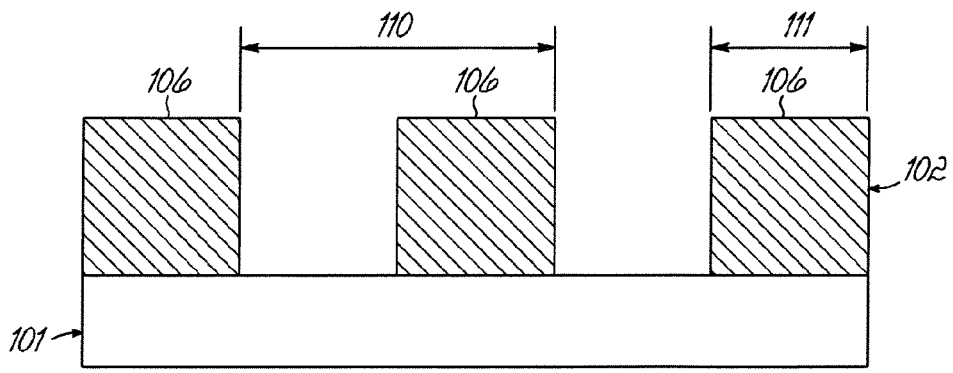
Figure 1C:
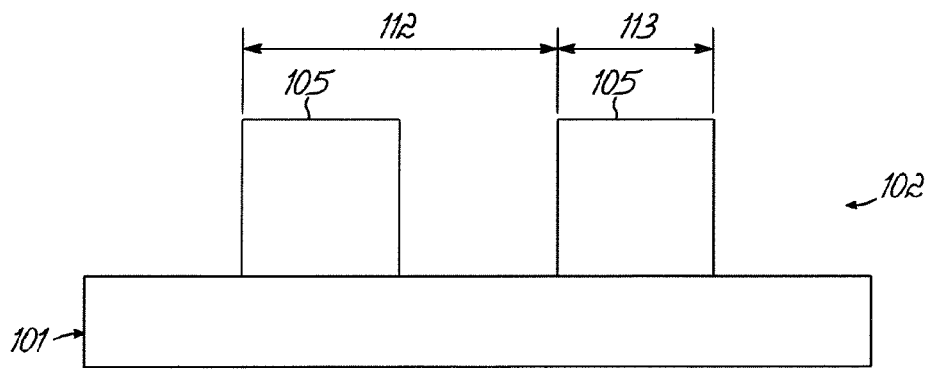
Figure 2:
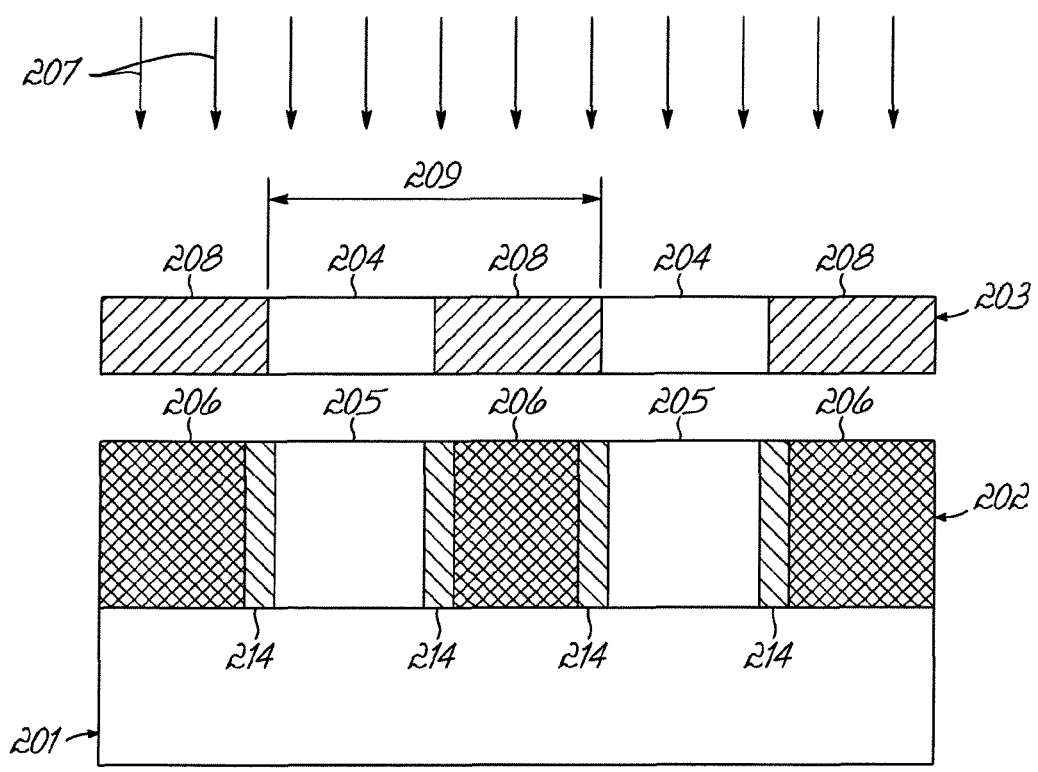
FIG. 2 illustrates further details in the lithographic pattern of the exposed radiation-sensitive material of FIG. 1A.
Figure 3:
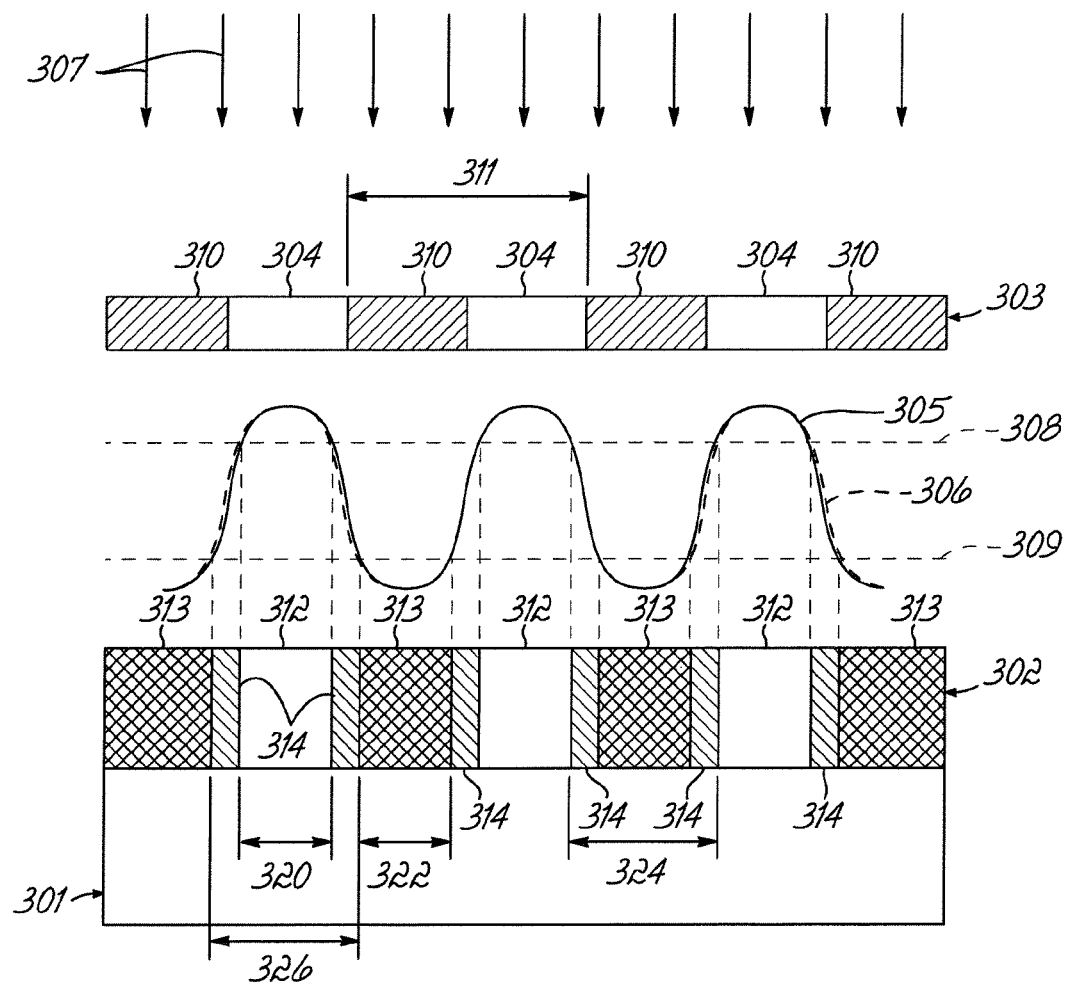
FIG. 3 illustrates a method of patterning a substrate.

Referencing FIG. 3, in accordance with embodiments of the present invention, a layer of radiation-sensitive material is formed on a substrate 301. The substrate 301 may comprise a semiconductor, e.g., mono-crystalline silicon, germanium, and any other semiconductor. In alternate embodiments, substrate 301 may comprise any material used to fabricate integrated circuits, passive microelectronic devices (e.g., capacitors, inductors) and active microelectronic devices (e.g., transistors, photo-detectors, lasers, diodes). Substrate 301 may include insulating materials that separate such active and passive microelectronic devices from a conductive layer or layers that are formed on top of them. In one embodiment, substrate 301 comprises a p-type mono-crystalline silicon substrate that includes one or more insulating layers e.g., silicon dioxide, silicon nitride, sapphire, and other insulating materials.

As described above, the substrate 301 may comprise a film stack having one or more thin films or layers disposed between a base layer and the layer of radiation-sensitive material 302. Each thin film in substrate 301 may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7. According to embodiments of the invention, the layer of radiation-sensitive material 302 may comprise, for example, a 248 nm radiation-sensitive material, a 193 nm radiation-sensitive material, a 157 nm radiation-sensitive material, or an extreme ultraviolet radiation-sensitive material, or a combination of two or more thereof. According to another embodiment, the layer of radiation-sensitive material 302 comprises a poly(hydroxystyrene)-based resist or a (meth)acrylate-based resist. According to another embodiment, the layer of radiation sensitive material 302 comprises a pinacol-based resist. According to another embodiment, the layer of radiation-sensitive material 302 comprises a material that switches solubility due to a change in polarity upon performing an exposure to radiation of the appropriate wavelength and thereafter performing a first post-exposure bake following the exposure; a thermal decomposition bake following the exposure to radiation; or an acid wash and performing a post-acid wash bake. For example, the material may decrease in polarity upon performing said exposure to radiation having the appropriate wavelength and thereafter performing said first post-exposure bake following the exposure; said thermal decomposition bake following the exposure to radiation; or said acid wash and said post-acid wash bake. It should be noted that the polarity of a material determines the ability of the material to interact with water and therefore its hydrophilicity or its hydrophobicity. In other words, reducing the polarity of a material will increase the hydrophobicity and reduce the hydrophilicity of the material.

According to another embodiment, the layer of radiation-sensitive material 320 comprises a material that provides acid-catalyzed rearrangement of a hydrophilic polymer to a more hydrophobic polymer upon performing an exposure to radiation having the appropriate wavelength and thereafter performing a first post-exposure bake following the exposure; a thermal decomposition bake; and/or an acid wash and a post-acid wash bake. According to another embodiment, the layer of radiation-sensitive material 302 comprises a material that provides acid-catalyzed de-protection upon performing an exposure to radiation having the appropriate wavelength and thereafter performing a first post-exposure bake following the exposure; a thermal decomposition bake; and/or an acid wash and a post-acid wash bake.

According to yet another embodiment, the layer of radiation-sensitive material 302 comprises an acid generator, such as a photo acid generator, a thermal acid generator and/or combinations thereof. Reference herein to "an acid generator" should be understood to synonymously refer to "one or more acid generators." According to yet another embodiment, the layer of radiation-sensitive material 302 comprises a protected polymer that undergoes de-protection upon heating to a temperature equal to or greater than a thermal decomposition temperature of said protected polymer. According to yet another embodiment, the layer of radiation-sensitive material 302 comprises a protected polymer that undergoes de-protection upon heating to a temperature equal to or greater than a thermal decomposition temperature of said protected polymer, after performing an acid wash treatment. According to yet another embodiment, the layer of radiation-sensitive material 302 comprises a hydrophilic polymer having a pinacol moiety that undergoes an acid-catalyzed rearrangement to a more hydrophobic polymer upon said exposing and said post-exposure bake following said exposing of said layer of radiation-sensitive material; said acid wash and said post-acid wash bake of said layer of radiation-sensitive material; said heating of said layer of radiation-sensitive material to said temperature equal to or greater than said thermal decomposition temperature of said radiation-sensitive material, or any combination of two or more thereof.

The layer of radiation-sensitive material 302 may be formed using a track system. For example, the track system can comprise a Clean Track ACT 8, ACT 12, or Lithius resist coating and developing system commercially available from Tokyo Electron Limited (TEL). Other systems and methods for forming a layer of radiation-sensitive material on a substrate are well known to those skilled in the art of spin-on resist technology.

Following the application of the layer of radiation-sensitive material 302 to substrate 301, the layer of radiation-sensitive material may be thermally treated in a post-application bake (PAB). For example, a temperature of the substrate may be elevated to between about 50° C. and about 200° C., for a duration of about 30 seconds to about 180 seconds. A track system having post-application substrate heating and cooling equipment may be used to perform the PAB, for example, one of the track systems described above. Other systems and methods for thermally treating an exposed radiation-sensitive material film on a substrate are well known to those skilled in the art of spin-on resist technology.

As shown in FIG. 3, the layer of radiation-sensitive material 302 is exposed to radiation 307 through a mask 303. The mask 303 comprises opaque regions 310 that prevent radiation 307 from being transmitted to the layer of radiation-sensitive material 302 and transparent regions 304 that transmit the radiation 307 to the layer of radiation-sensitive material 302. The mask 303 may include any mask suitable for use in wet (e.g., immersion) or dry lithography, including wavelengths ranging from about 365 nm to about 13 nm. The mask 303 may include a binary mask or chrome on glass mask. Alternatively, the mask 303 may include an alternating phase shift mask, or an embedded phase shift mask.

The exposure of the layer of radiation-sensitive material 302 to the pattern of EM radiation may be performed in a dry or wet photo-lithography system. The lithography system may be capable of providing a pattern of EM radiation at wavelengths of 365 nm, 248 nm, 193 nm, 157 nm, and 13 nm, for example. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). The mask 303 can be illuminated, for example, with normal incident light and off-axis illumination light, such as annular illumination, quadrupole illumination, and dipole illumination. These methods of illumination and exposing the layer of radiation-sensitive material 302 to radiation using the mask 303 are known to one of ordinary skill in the art of microelectronic device manufacturing.

A track system, as described above, having post-exposure substrate heating and cooling equipment may be used to perform a post-exposure bake (PEB). Other systems and methods for thermally treating an exposed layer of radiation-sensitive material on a substrate are well known to those skilled in the art of spin-on resist technology.

In further reference to FIG. 3, there is shown a radiation exposure profile 305 and a response profile 306 produced in the layer of radiation-sensitive material 302 by a pattern of radiation resulting from the projection of radiation 307 through the mask 303 using a lithography system. As shown in FIG. 3, the first regions 312 that correspond to the transparent regions 304 receive a high radiation exposure from radiation 307, the second regions 313 that correspond to the opaque regions 310 receive a low radiation exposure from radiation 307, and the third regions 314 that approximately correspond to edges of the opaque regions 310 receive an intermediate or gradient radiation exposure that ranges from about a high radiation exposure to about an low radiation exposure from radiation 307. The response profile 306 corresponding to the first regions 312 of the layer of radiation-sensitive material 302 is higher than an upper threshold 308, while the response profile 306 corresponding to the second regions 313 is lower than a lower threshold 309. Further, the response profile 306 corresponding to the third regions 314 lies between the lower threshold 309 and the upper threshold 308. Further, the response profile 306 corresponding to the third regions 314 may represent a gradient of exposure across a width of the third regions 314.

In one embodiment, the response profile 306 may represent the acid concentration in the layer of radiation-sensitive material 302 that is proportional to radiation exposure profile 305, as shown in FIG. 3. The acid present in the layer of radiation-sensitive material 302 may facilitate the acid-catalyzed de-protection of a protected polymer and/or rearrangement of a hydrophilic polymer to a more hydrophobic polymer. As such, the acid concentration may be proportional to the chemical concentration of de-protected and/or rearranged polymers in the layer of radiation-sensitive material 302. Thus, in another embodiment, the response profile 306 may represent a chemical concentration of de-protected and/or rearranged polymers in the layer of radiation-sensitive material 302 that is approximately proportional to the radiation exposure profile 305.

In one embodiment, the upper threshold 308 corresponds to a first threshold of solubility of the layer of radiation-sensitive material 302 when a first developing chemistry is applied. In one embodiment, the lower threshold 309 corresponds to a second threshold of solubility of the layer of radiation-sensitive material 302 when a second developing chemistry is applied.

In one embodiment, the first regions 312 of the layer of radiation-sensitive material 302 that correspond to the transparent regions 304 of the mask 303 and that have high radiation exposure in the radiation exposure profile 305 are selectively removed from the substrate 301 using a first developing chemistry. The second regions 313 of the layer of radiation-sensitive material 302 that have low radiation exposure in the radiation exposure profile 305 may be selectively unaffected or minimally-affected by exposure to the first developing chemistry. The third regions 314 that correspond approximately to the edges of opaque regions 310 and that have intermediate exposure in the radiation exposure profile 305 (i.e., radiation exposure between the upper threshold 308 and the lower threshold 309) may remain on the substrate 301, but may show a selectivity of resistance to the first developing chemistry that would be proportional to the relative level of exposure, protection, and/or rearrangement.

Conversely, the second regions 313 of the layer of radiation-sensitive material 302, which have low radiation exposure in the radiation exposure profile 305, may be selectively removed by exposure to the second developing chemistry. The first regions 312 of the layer of radiation-sensitive material 302, which correspond to the transparent regions 304 and have high radiation exposure in the radiation exposure profile 305, may be selectively unaffected or minimally-affected by exposure to the second developing chemistry. The third regions 314, which correspond approximately to the edges of opaque regions 310 and have intermediate exposure in the radiation exposure profile 305 (i.e., radiation exposure between the upper threshold 308 and the lower threshold 309), may remain on the substrate 301 but show a resistance to the second developing chemistry that would be proportional to the relative level of exposure, protection, and/or rearrangment.

In one embodiment, for the first regions 312, the response profile 306 includes a concentration of acid in the layer of radiation-sensitive material 302 that is higher than the upper threshold 308 of acid concentration. In one embodiment, the upper threshold 308 represents an acid level solubility threshold of the layer of radiation-sensitive material 302. For example, if an acid concentration in the layer of radiation-sensitive material 302 is higher than the upper threshold 308 of acid concentration, the layer of radiation-sensitive material 302 is soluble in a first developing chemistry.

In one embodiment, for the second regions 313, the response profile 306 includes a concentration of acid in the layer of radiation-sensitive material 302 that is lower than the lower threshold 309 of acid concentration. In one embodiment, the lower threshold 309 represents another acid level solubility threshold of the layer of radiation-sensitive material 302. For example, if acid concentration in the layer of radiation-sensitive material 302 is lower than lower threshold 309 of acid concentration, the layer of radiation-sensitive material 302 is soluble in a second developing.

In one embodiment, the upper threshold 308 of acid concentration ranges from about 30% to about 60% of the clear field acid level and the lower threshold 309 of acid concentration ranges from about 10% to about 25% of the clear field acid concentration. In one embodiment, the clear field acid concentration is defined as the acid level of the radiation-sensitive material completely exposed to radiation. In another embodiment, the clear field acid concentration is defined as the acid concentration when substantially all the acid generator material has reacted with radiation 307 to produce acid species or when substantially all the thermal acid generator has decomposed to produce acid species.

Due to diffraction of radiation 307 by the mask 303, the third regions 314 corresponding to intermediate radiation exposure are created. In one embodiment, the third regions 314 comprise an acid concentration between the upper threshold 308 and the lower threshold 309. The first regions 312 corresponding to high radiation exposure may be selectively removed from the substrate 301 using a first developing chemistry. The second regions 313 corresponding to low radiation exposure may be selectively removed from the substrate 301 using a second developing chemistry. The third regions 314 corresponding to intermediate radiation exposure may substantially remain on substrate 301 during the first and/or second developing chemistries.

Referring still to FIG. 3, the first regions 312 may be characterized by a first critical dimension 320. For example, the first critical dimension may be related to a positive-tone critical dimension following positive-tone developing. Additionally, the second regions 313 may be characterized by a second critical dimension 322. For example, the second critical dimension 322 may be related to a negative-tone critical dimension following negative-tone developing.

A third critical dimension 324 may be related to a positive-tone developing of an imaged radiation-sensitive material. The third critical dimension 324 includes the second region 313 and the adjoining third region(s) 314. A fourth critical dimension 326 may be related to a negative-tone developing of an imaged radiation-sensitive material. The fourth critical dimension 326 includes the first region 312 and the adjoining third region(s) 314.

As used herein, positive-tone developing chemistry refers to a solvent system that selectively removes the first regions 312 having a high radiation exposure. According to one embodiment, the positive-tone developing chemistry includes a base, e.g., alkali, amines, etc. In one example, the positive-tone developing chemistry to selectively remove the first regions 312 includes tetramethylammonium hydroxide (TMAH). A typical and commercially-available form of TMAH solution is a 0.26 N solution, which can be diluted if desired. In another example, the positive-tone developing chemistry to selectively remove the first regions 312 includes a base, water, and an optional surfactant. According to another embodiment, the positive-tone developing chemistry includes an organic solvent-based composition. In one example, the positive tone developing chemistry includes anisole, n-butyl acetate, 2-heptanone, ethyl-3-ethoxy-propionate, or combinations thereof, and may further comprise additional organic compounds, optionally water and/or an optional surfactant.

As used herein, a negative-tone developing chemistry refers to a solvent system that selectively removes the second regions 313, having the low radiation exposure. According to one embodiment, the negative-tone developing chemistry may comprise an organic solvent. In one example, negative-tone developing chemistry includes anisole, n-butyl acetate, 2-heptanone, ethyl-3-ethoxy-propionate, or combinations thereof, and may further comprise additional organic compounds, optionally water, and an optional surfactant. According to another embodiment, the negative-tone developing chemistry includes a base, e.g., alkali, amines, etc. In one example, the positive-tone developing chemistry to selectively remove the first regions 312 includes tetramethylammonium hydroxide (TMAH) or potassium hydroxide (KOH). In another example, the positive-tone developing chemistry to selectively remove the first regions 312 includes a base, water, and an optional surfactant.

To better understand the properties of the development chemistries utilized to develop imaged radiation-sensitive materials, the following terms are defined. $R_{MIN}$ is defined as the minimum development rate. $R_{MAX}$ is defined as the maximum development rate. Development rates may be conveniently described in nanometers per second. For positive-tone development, the $R_{MIN}$ is observed at low levels of de-protection and/or exposure, whereas $R_{MAX}$ is observed at high levels of de-protection and/or exposure. In contrast, for negative-tone development, the $R_{MIN}$ is observed at high levels of de-protection and/or exposure, whereas $R_{MAX}$ is observed at low levels of de-protection and/or exposure.

Figure 4A:
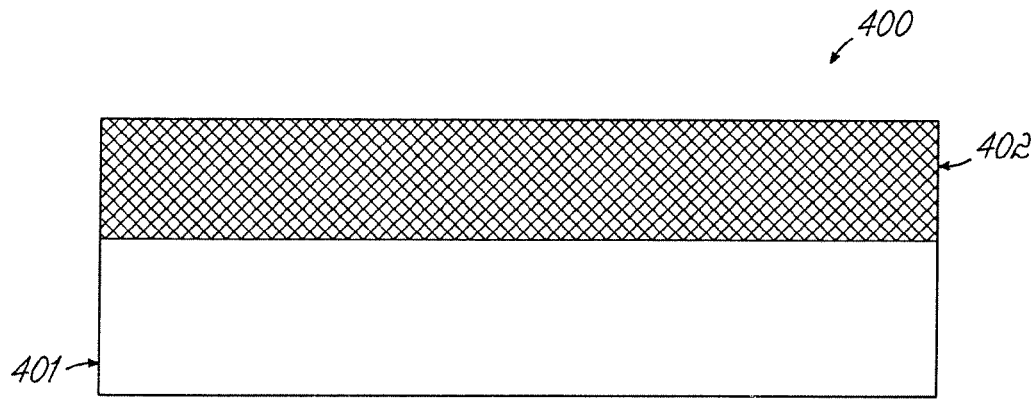
FIGS. 4A through 4H illustrate complementary methods of patterning a substrate.
Figure 4B:
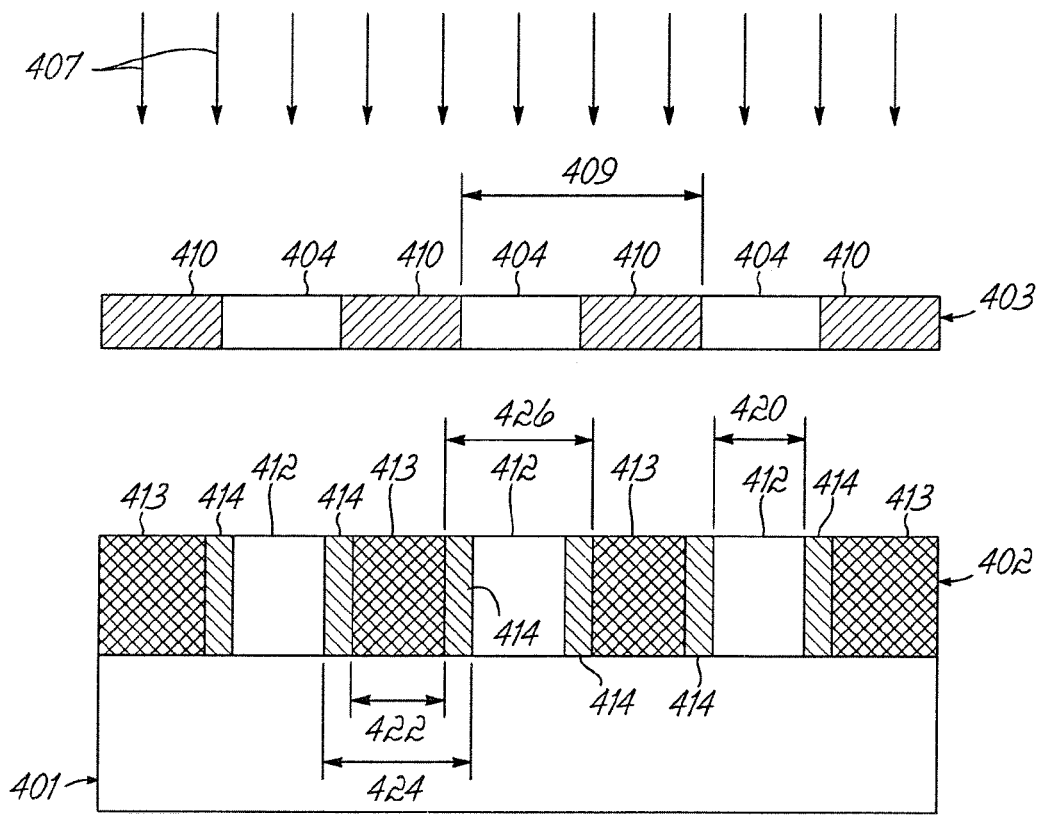

An exemplary embodiment comprising a radiation-sensitive material is shown in FIGS. 4A-4E. Film stack 400 comprises a substrate 401 coated with a layer of radiation-sensitive material 402 that comprises an acid generator that is capable of converting to acid when exposed to radiation. Radiation 407 is projected through a mask 403 onto the layer of radiation-sensitive material 402. As shown in FIG. 4B, the first regions 412 in the layer of radiation-sensitive material 402 correspond to the transparent regions 404 in the mask 403 and receive a high radiation exposure from radiation 407. The second regions 413 in the layer of radiation-sensitive material 402 correspond to opaque regions 410 in the mask 403 and receive a low radiation exposure from radiation 407. The third regions 414 in the layer of radiation-sensitive material 402 approximately correspond to edges of the opaque regions 410 in the mask 403 and receive an intermediate radiation exposure ranging from about the high radiation exposure to about the low radiation exposure from radiation 407.

As further characterization of the regions 412-414, in one embodiment, the first region 412 may have a high percent conversion of acid generator to acid as a result of the high radiation exposure, the second region 413 may have a low percent conversion of acid generator to acid as a result of the low radiation exposure, and the third region 414 may have an exposure gradient wherein the percent conversion of acid generator to acid ranges from about the high percent conversion to about the low percent conversion as a result of the intermediate radiation exposure that ranges from high to low.

Referring still to FIG. 4B, the first regions 412 may be characterized by a first critical space dimension 420. For example, the first critical space dimension 420 may be related to positive-tone developing with a first chemistry to remove the first region 412, or in the alternative, to negative-tone developing with a second chemistry to remove the second region 413 followed by slimming. Additionally, the second regions 413 may be characterized by a second critical space dimension 422. For example, the second critical space dimension 422 may be related to negative-tone developing with a second chemistry to remove the second region 413, or in the alternative, to positive-tone developing with the first chemistry to remove the first region 412 followed by slimming.

Further, a third critical dimension 424 may be related to the layer of radiation-sensitive material 402 remaining following the positive-tone developing, and a fourth critical dimension 426 maybe related to the layer of radiation-sensitive material 402 remaining following the negative-tone developing. The layer of radiation-sensitive material 402 remaining after developing, such as those features characterized by the third and fourth critical dimensions 424, 426 are commonly referred to as radiation-sensitive material lines. For example, when the radiation-sensitive material is a photoresist, features defined by the third and fourth critical dimensions 424, 426 are commonly referred to as photoresist lines.

In one embodiment, the first regions 412 corresponding to high radiation exposure receive about 50% or more of radiation 407 incident on substrate 401, the second regions 413 corresponding to low radiation exposure receive less than 15% of the radiation 407 incident on substrate 401, and the third regions 414 corresponding to intermediate radiation exposure receive between about 15% and about 50% of the radiation 407 incident on substrate 401.

In one embodiment, high exposure to radiation 407 increases the concentration of an acid in the first regions 412 to a level higher than an upper acid concentration threshold. The upper acid concentration threshold is related to a first threshold of solubility of the layer of radiation-sensitive material 402 to a developing chemistry. In one embodiment, when the concentration of the acid in the first regions 412 increases to a level higher than the first threshold of solubility of the layer of radiation-sensitive material 402 (e.g., acid concentration threshold) to the first developing chemistry, the first regions 412 become soluble when the first developing chemistry is applied, and/or are insoluble to the second developing chemistry.

In another embodiment, when the chemical concentration of de-protected polymers in the first regions 412 increases to a level higher than the first threshold of solubility of the layer of radiation-sensitive material 402 (e.g., acid concentration threshold) to the first developing chemistry, the first regions 412 become soluble when the first developing chemistry is applied, and/or are insoluble to the second developing chemistry.

In another embodiment, when the chemical concentrations of acid-catalyzed rearranged polymers in the first regions 412 increase to a level higher than the threshold of solubility of the layer of radiation-sensitive material 402, the first regions 412 become soluble to the first developing chemistry, and/or are insoluble to the second developing chemistry.

In the second regions 413 corresponding to low radiation exposure, a concentration of an acid and/or chemical concentration of de-protected or rearranged polymers is less than a lower threshold of solubility of the layer of radiation-sensitive material 402 (e.g., acid concentration threshold) to the first developing chemistry. The second regions 413 are soluble in the second developing chemistry, and/or are insoluble to the first developing chemistry.

Typically, the first solubility threshold and the second solubility threshold are determined by a material property of the layer of radiation-sensitive material 402. The third regions 414 corresponding to an intermediate radiation exposure have an exposure gradient wherein an acid concentration ranges between about the first solubility threshold and the second solubility threshold. That is, the third regions 414 are not readily soluble when either of the first developing chemistry or the second developing chemistry is applied to layer of radiation-sensitive material 402.

Following the exposure of the layer of radiation-sensitive material 402 to EM radiation 407, the exposed layer of radiation-sensitive material 402 may be thermally treated in a first post-exposure bake (PEB). For example, a temperature of the substrate may be elevated to between about 50° C. and about 200° C. for a duration of about 30 seconds to about 180 seconds. The PEB may be performed in a module of the track system.

Figure 4C:
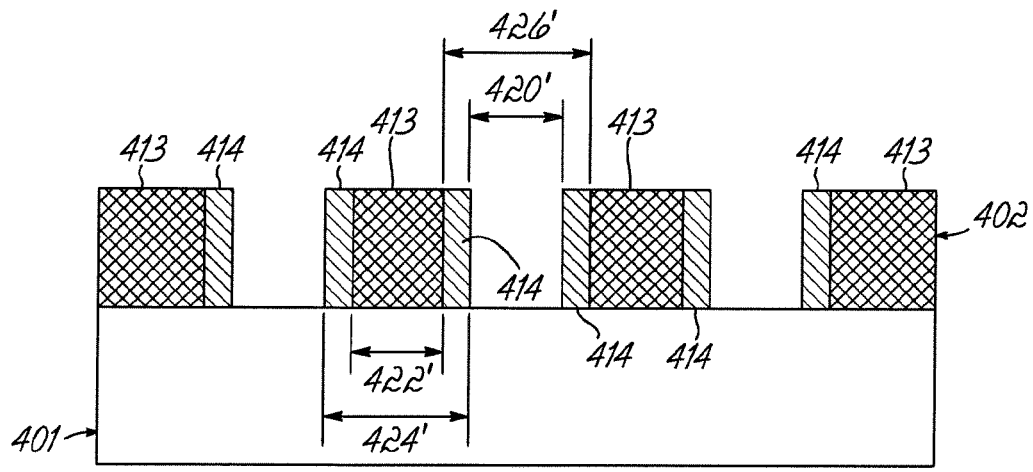

Referring now to FIG. 4C, the first regions 412 corresponding to high radiation exposure may be selectively removed using a positive-tone developing of the layer of radiation-sensitive material 402 using a first developing chemistry. In one embodiment, the first developing chemistry to selectively remove the first regions 412 includes a base, e.g., alkali, amines, etc. In one embodiment, the first developing chemistry to selectively remove the first regions 412 includes TMAH or KOH. In another embodiment, the first developing chemistry to selectively remove the first regions 412 includes a base, water, and an optional surfactant. In yet another embodiment, the first developing chemistry to remove the first regions 412 is an organic solvent-based composition.

In one embodiment, substrate 401 having the exposed layer of radiation-sensitive material 402 is brought into contact with a development solution containing the first developing chemistry to remove first regions 412 that are soluble in the first developing chemistry. Thereafter, the substrate 401 is dried. The developing process may be performed for a pre-specified time duration (e.g., about 30 seconds to about 180 seconds), a pre-specified temperature (e.g., room temperature), and a pre-specified pressure (e.g., atmospheric pressure). The developing process can include exposing the substrate to a developing solution in a developing system, such as a track system, for example, the track systems described above.

As shown in FIG. 4C, a first critical dimension 420' (corresponding to the areas where the first regions 412 have been removed), a second critical dimension 422' (corresponding to the second regions 413), a third critical dimension 424' (corresponding to a second region 413 having a third region 414 on both sides), and a fourth critical dimension 426' (corresponding to a removed area having a third region 414 on both sides) may be adjusted, controlled, and/or optimized, as will be discussed below.

As illustrated in FIG. 4C, the second regions 413 and the third regions 414 remain on substrate 401 and make up the radiation-sensitive material lines.

Figure 4D:
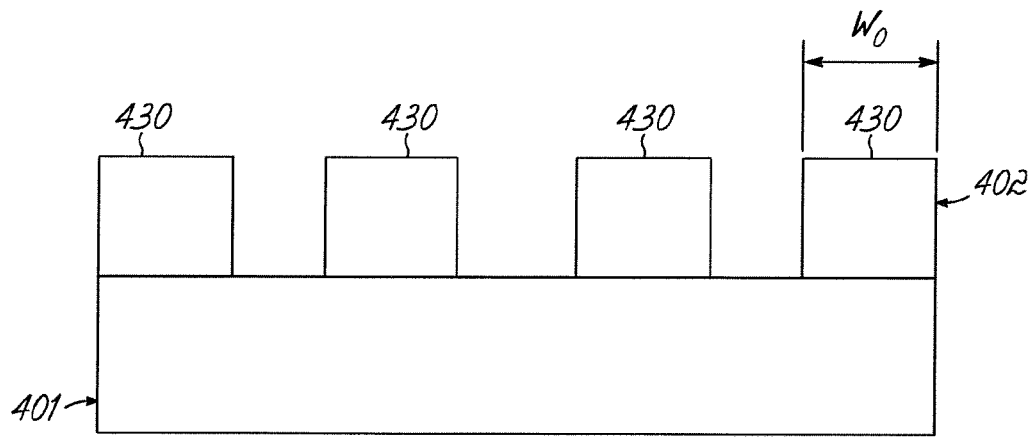

In reference to FIG. 4D, after performing the first developing chemistry treatment of the layer of radiation-sensitive material 402, the exposed layer of radiation-sensitive material 402 is subjected to conditions that form a fourth region 430. The third regions 414 and the second regions 413 are converted to substantially uniform levels of radiation exposure or de-protection, polarity, or a combination thereof, and thereby form the fourth regions 430.

In one embodiment, the fourth regions 430 have a substantially uniform high percent conversion of acid generator to acid which subsequently lead to substantially uniform regions of de-protected polymers. Exemplary methods of affecting the high percent conversion of the acid generator to acid in the third region 414 and the second region 413 to form the fourth region 430 include a flood exposure of radiation, acid wash treatment, performing a bake at an elevated temperature, and combinations thereof. In another aspect of this embodiment, the fourth regions 430 are substantially uniform regions of de-protected polymers. The substantial uniformity of the de-protection level in the fourth regions 430 permits uniform reactivity with a subsequent chemistry, i.e., the uniformity permits substantially isotropic slimming. Thus, after the removal of the exposure gradient, a dimension $W_O$ (i.e., the existing critical dimension 424') may be slimmed to the desired or target critical dimension $W_f$ as shown in FIG. 4E, by a substantially isotropic removal of a thickness x from the fourth region 430 to form the desired fifth region 432.

Figure 4E:
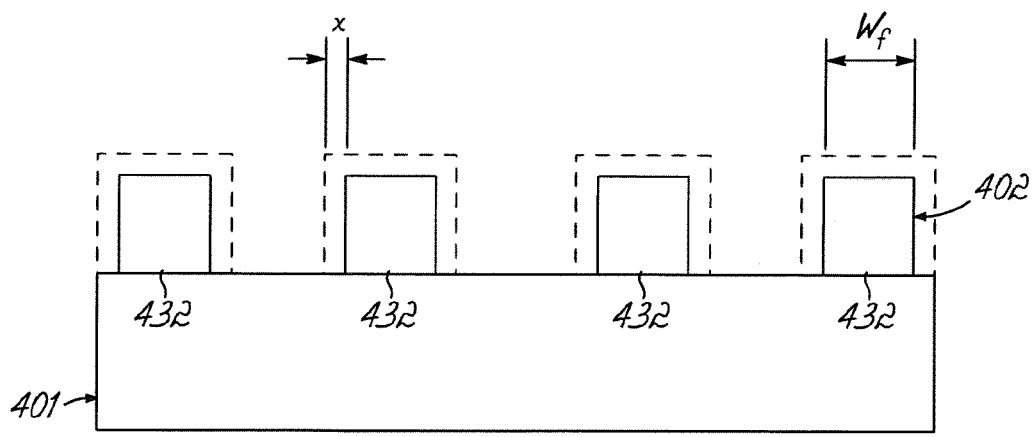

In reference to FIG. 4E, according to embodiments of the invention using common chemically-amplified positive resists such as a protected polyhydroxystyrene-based resists, substantially isotropic removal of thickness x from radiation-sensitive material lines, i.e., fourth region 430, to provide a slimmed radiation-sensitive material line, i.e., fifth region 432, having a critical dimension $W_f$ may be accomplished by: adjusting a composition of an organic solvent-based composition chemistry, adjusting a concentration of an aqueous base composition chemistry, adjusting a composition of the layer of radiation-sensitive material to provide a muted layer; adjusting a duration for applying the organic solvent-based composition or the aqueous base composition developing chemistry; adjusting a temperature of the developing chemistry, or a combination of two or more thereof. Conversely, according to embodiments of the invention using other chemically-amplified resists such as a pinacol-based resists, substantially isotropic removal of a thickness x from the fourth region 430 to provide slimmed fifth region 432 having a critical dimension $W_f$ may be accomplished by: using a low $R_{MAX}$ organic solvent and/or adjusting a composition of an organic solvent-based composition chemistry, using conventional aqueous base compositions, adjusting the composition of an aqueous base composition with promoters, adjusting a temperature of the developing chemistry, or a combination of two or more thereof.

Figure 4F:
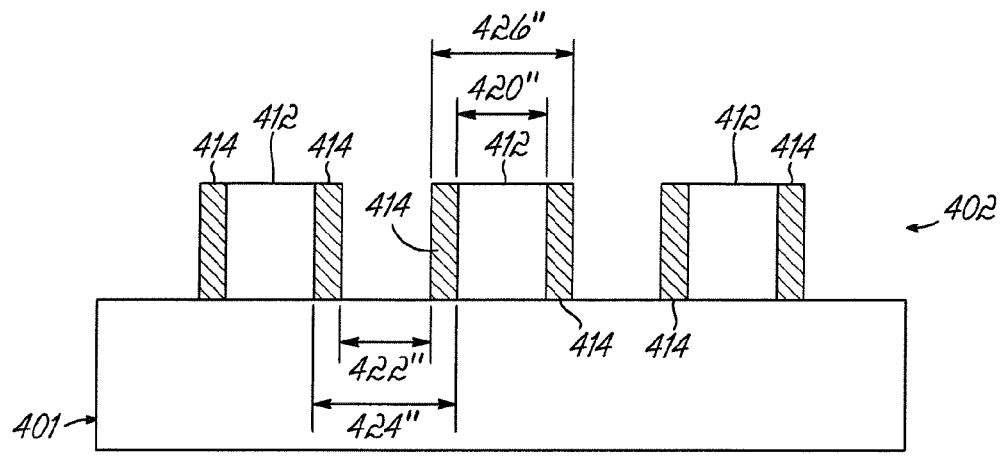

Referring now to FIGS. 4B and 4F, the second regions 413 corresponding to low radiation exposure may be selectively removed using a negative-tone developing process of the layer of radiation-sensitive material 402 with suitable chemistry for selective removal of second regions 413 over first regions 412 and third regions 413. In one embodiment of the invention using common chemically-amplified resists such as protected polyhydroxystyrene-based resists, the second developing chemistry to selectively remove the second regions 413 includes an organic solvent-based composition. According to another embodiment of the invention using other chemically-amplified resists such as pinacol-based resists, the second regions 413 may be removed using a suitable solvent, such as a polar alcoholic solvent.

As shown in FIG. 4F, a first critical dimension 420" (corresponding to the first regions 412), a second critical dimension 422" (corresponding to the areas where the second regions 413 have been removed), a third critical dimension 424" (corresponding to a removed area having a third region 414 on both sides), and a fourth critical dimension 426" (corresponding to a first region 412 having a third region 414 on both sides) may be adjusted, controlled, and/or optimized, as will be discussed below.

As illustrated in FIG. 4F, the first regions 412 and the third regions 414 remain on substrate 401 and make up the radiation-sensitive material lines.

Figure 4G:
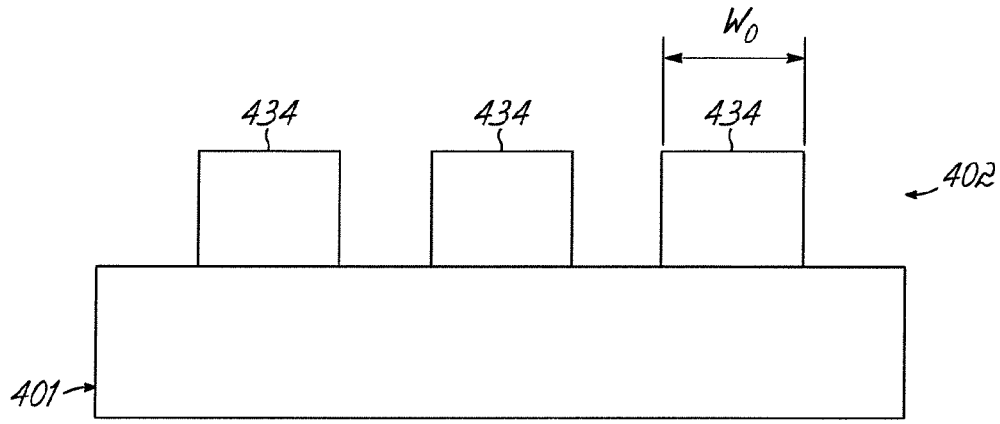

In reference to FIG. 4G, after performing the first developing chemistry treatment of the layer of radiation-sensitive material 402, the exposed layer of radiation-sensitive material 402 is subjected to conditions that form a fourth region 434. The third regions 414, and optionally the first regions 412, are converted to substantially uniform levels of radiation exposure, polarity or de-protection, or a combination thereof, and thereby form the fourth regions 434 from the combination of the first and third regions 412, 414. Suitable methods of achieving the conversion include those disclosed above.

Figure 4H:
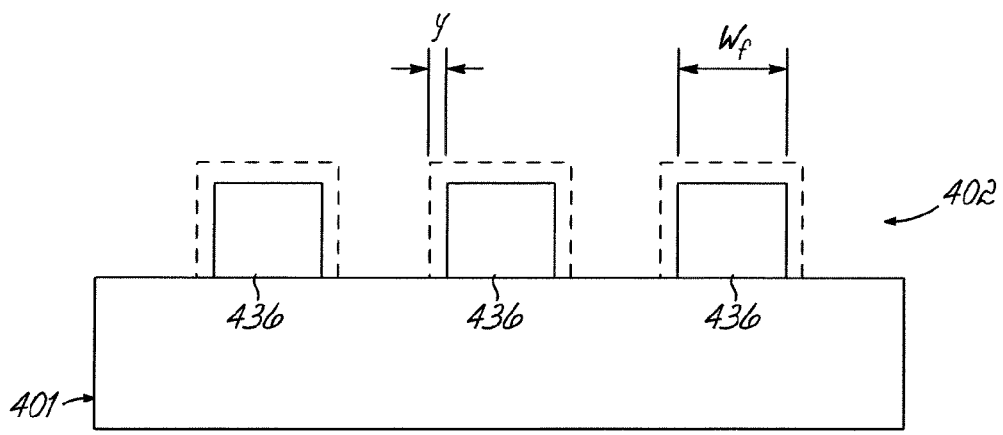

The substantial uniformity of the de-protection level in the fourth regions 434 permits uniform reactivity with a subsequent chemistry, i.e., the uniformity permits substantially isotropic slimming. Thus, after the removal of the exposure gradient, a dimension $W_O$ (i.e., the existing critical dimension 426") may be slimmed to the desired or target critical dimension $W_f$ as shown in FIG. 4H, by a substantially isotropic removal of a thickness y from the fourth region 434 to form the desired fifth region 436.

Figure 5:
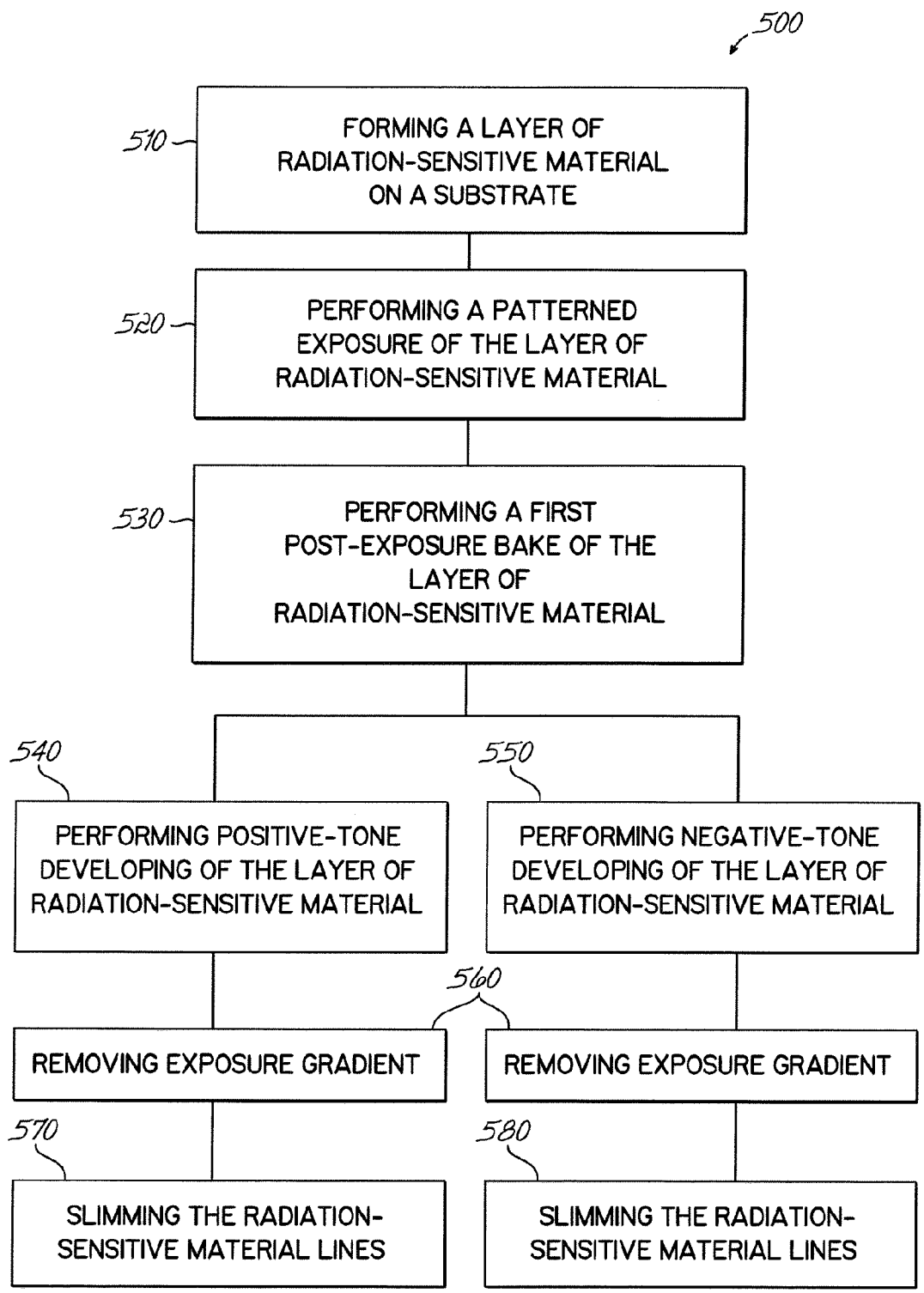
FIG. 5 illustrates a method of patterning a substrate according to one embodiment of the invention.

Referring now to FIG. 5, a flow chart 500 of a method of patterning a substrate is presented according to an embodiment of the present invention. Flow chart 500 begins in 510 with forming a layer of radiation-sensitive material, which includes a protected polymer and an acid generator, on a substrate. In 520, the method includes performing a patterned exposure of the layer of radiation-sensitive material. During the patterned exposure, the layer of radiation-sensitive material is exposed to a pattern of electromagnetic radiation (EM) radiation using a mask having a mask critical dimension (CD) to form first regions, second regions, and third regions. The mask CD may include any critical dimension to characterize opaque regions of the mask, transparent regions of the mask, mask pitch, etc. The first regions may be characterized as having high radiation exposure. The second regions may be characterized as having low radiation exposure. The third regions may be characterized as having intermediate radiation exposure.

In 530, a post-exposure bake (PEB) is performed, wherein a temperature of the substrate is elevated to a post-exposure temperature. The PEB may comprise setting the post-exposure temperature, a time the substrate is elevated to the post-exposure temperature, a heating rate for achieving the post-exposure temperature, a cooling rate for reducing the post-exposure temperature, a pressure of a gaseous environment surrounding the substrate during the elevation of the substrate to the post-exposure temperature, or a composition of a gaseous environment surrounding the substrate during the elevation of the substrate to the post-exposure temperature, or a combination of two or more thereof. The post-exposure temperature may be ramped, or stepped.

After completion of the post-exposure bake, two options exist for developing the imaged layer of photoresist. In 540, positive-tone developing of the layer of radiation-sensitive material is performed, wherein the first regions are removed from the substrate using a first developing chemistry. The removal of the first regions may be characterized by a first critical dimension. The positive-tone developing process may comprise setting a composition of the first developing chemistry, time duration for applying the first developing chemistry, or a temperature for applying the first developing chemistry, or any combination of two or more thereof. According to one embodiment, the first developing chemistry may comprise a polar composition, such as a base solution. The first developing chemistry may further comprise a base solution, water, and an optional surfactant. According to another embodiment, the first developing chemistry may comprise a non-polar composition, such as an organic solvent-based composition. Thereafter, what remains is a layer of radiation-sensitive material comprising second regions having low radiation exposure, with third regions having intermediate exposure located immediately adjacent the second regions. It is this combination of second and third regions that form the radiation-sensitive material lines.

In 550, a complementary embodiment to that of 540, negative-tone developing of the layer of radiation-sensitive material is performed, wherein the second regions are removed from the substrate using a second developing chemistry. The removal of the second regions may be characterized by a second critical dimension. The negative-tone developing process may comprise setting a composition of the second developing chemistry, time duration for applying the second developing chemistry, or a temperature for applying the second developing chemistry, or any combination of two or more thereof. According to one embodiment, the second developing chemistry may comprise a non-polar composition, such as an organic solvent-based composition. According to another embodiment, the second developing chemistry may comprise a polar composition, such as an alcoholic solvent. Thereafter, what remains is a layer of radiation-sensitive material comprising first regions having high radiation exposure, with third regions having intermediate exposure located immediately adjacent the first regions. It is this combination of the first and third regions that form the radiation-sensitive material lines.

In 560, the radiation-sensitive material lines, which comprise second and third regions after performing 540, or which comprise first and third regions after performing 550, are exposed to chemistry and/or conditions that affect a high percent conversion of the acid generator to acid, affect a high percent de-protection of the polymer, or affect an acid-catalyzed rearrangement of a hydrophilic polymer to a more hydrophobic polymer. The exposure gradient removal can be achieved by performing an operation, such as a flood exposure that is followed by a post-flood exposure bake; a thermal decomposition bake, or acid wash that is followed by a post-acid wash bake. These methods of removing the exposure gradient yield a fourth region, derived from combination of the second and the third regions, or the first and the third regions. These methods, as discussed further below, render the fourth region having approximately uniform de-protection and/or polarity, and in-sensitive to radiation.

In 570 and 580, slimming of the fourth region is performed, wherein the dimensions of a radiation-sensitive material line are reduced in a substantially uniform manner. According to embodiments of the present invention, this can be achieved by various methods, as will be discussed further below.

Figure 6:
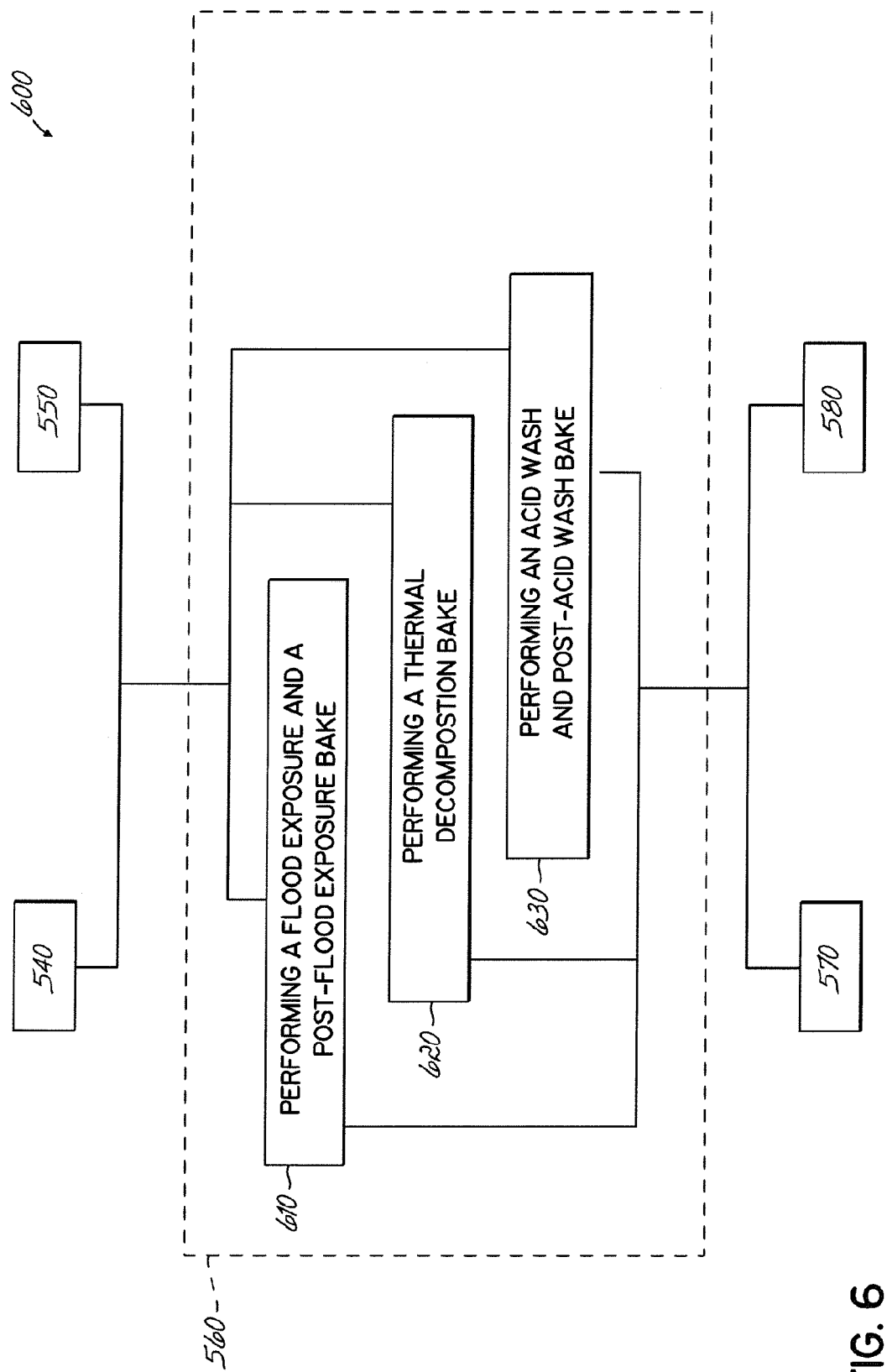
FIG. 6 illustrates a method of patterning a substrate according to another embodiment of the invention.

Referring to FIG. 6, a flow-chart 600 provides alternative methods of removing the exposure gradient of at least the third region of a radiation-sensitive material line to provide a layer having approximately uniform de-protection and/or polarity, i.e., performing the removing exposure gradient in 560 after positive-tone developing 540 or negative-tone developing 550, shown in FIG. 5. In 610, according to one embodiment of the invention, a flood exposure of the layer of radiation-sensitive material may be performed. During the flood exposure, the layer of radiation-sensitive material is exposed to un-patterned radiation. The flood exposure may comprise exposing the substrate to electromagnetic (EM) radiation without a mask or reticle. The EM radiation may possess a wavelength in the visible spectrum, or a wavelength in the ultraviolet spectrum, or a combination thereof. Additionally, the flood exposure may comprise exposing the substrate to continuous EM radiation, pulsed EM radiation, polychromatic EM radiation, mono-chromatic EM radiation, broad-band EM radiation, or narrow-band radiation, or a combination thereof.

For example, the flood exposure may comprise exposing the substrate to 436 nm EM radiation, 365 nm EM radiation, 248 nm EM radiation, 193 nm EM radiation, 157 nm EM radiation, or deep ultraviolet (DUV) EM radiation, or any combination of two or more thereof. Additionally, for example, the flood exposure may comprise exposing the substrate to EM radiation at a wavelength capable of creating acid in the layer of radiation-sensitive material.

Subsequent to the flood exposure, a post-flood exposure bake (PFEB) is performed, wherein a temperature of the substrate is elevated to a PFEB temperature. The post-flood exposure bake may comprise setting the PFEB temperature, a time the substrate is elevated to the PFEB temperature, a heating rate for achieving the PFEB temperature, a cooling rate for reducing the PFEB temperature, a pressure of a gaseous environment surrounding the substrate during the elevation of the substrate to the PFEB temperature, or a composition of a gaseous environment surrounding the substrate during the elevation of the substrate to the PFEB temperature, or a combination of two or more thereof.

In 620, according to another embodiment of the invention, thermal decomposition bake (TDB) of the layer of radiation-sensitive material may be performed. For a thermal decomposition bake, the TDB temperature may include a temperature at which an acid generator will substantially undergo a thermal decomposition to produce acid and thereby facilitate the acid-catalyzed decomposition of the radiation-sensitive material or the acid-catalyzed rearrangement of a hydrophilic polymer to a more hydrophobic polymer; or a temperature at which a protected polymer, such as a tert-butyl carbonate (tBOC) protected radiation-sensitive material, will substantially de-protect. In any event, the end result is substantially removing the exposure gradient of the third region, as well as substantially de-protecting/reducing polarity/decomposing the previously unexposed second region of the layer of radiation-sensitive material. It should be noted that the baking temperature should not exceed the glass transition temperature (Tg) of the layer of radiation-sensitive material.

In 630, according to yet another embodiment of the invention, an acid wash of the layer of radiation-sensitive material may be performed. An acid wash may provide a sufficient quantity of acid to the surface of the layer of radiation-sensitive material that upon heating to a sufficient temperature, it may facilitate or enhance de-protection or thermal decomposition of the radiation-sensitive material. A suitable acid wash may comprise exemplary acidic compounds, such as sulfuric acid and dichloroacetic acid. In 570 and 580, slimming of the fourth region is performed.

In reference to FIG. 6, a flow chart 600 of a method of patterning a substrate is presented according to an embodiment of the present invention. Flow chart 600 begins in 610 with forming a layer of radiation-sensitive material on a substrate, and in 620, performing a patterned exposure of the layer of radiation-sensitive material. In 630, a first post-exposure bake (PEB) is performed, wherein a temperature of the substrate is elevated to a PEB temperature. In 640, positive-tone developing of the imaged layer of radiation-sensitive material is performed, wherein the first regions are removed from the substrate using a first developing chemistry. In 650, a flood exposure of the layer of radiation-sensitive material may be performed. During the flood exposure, the layer of radiation-sensitive material is exposed to un-patterned radiation. In 660, a post-flood exposure bake (PFEB) is performed, wherein a temperature of the substrate is elevated to a PFEB temperature. In 670, slimming of the radiation-sensitive material is performed, wherein the dimensions of a radiation-sensitive material line are reduced.

Figure 7:
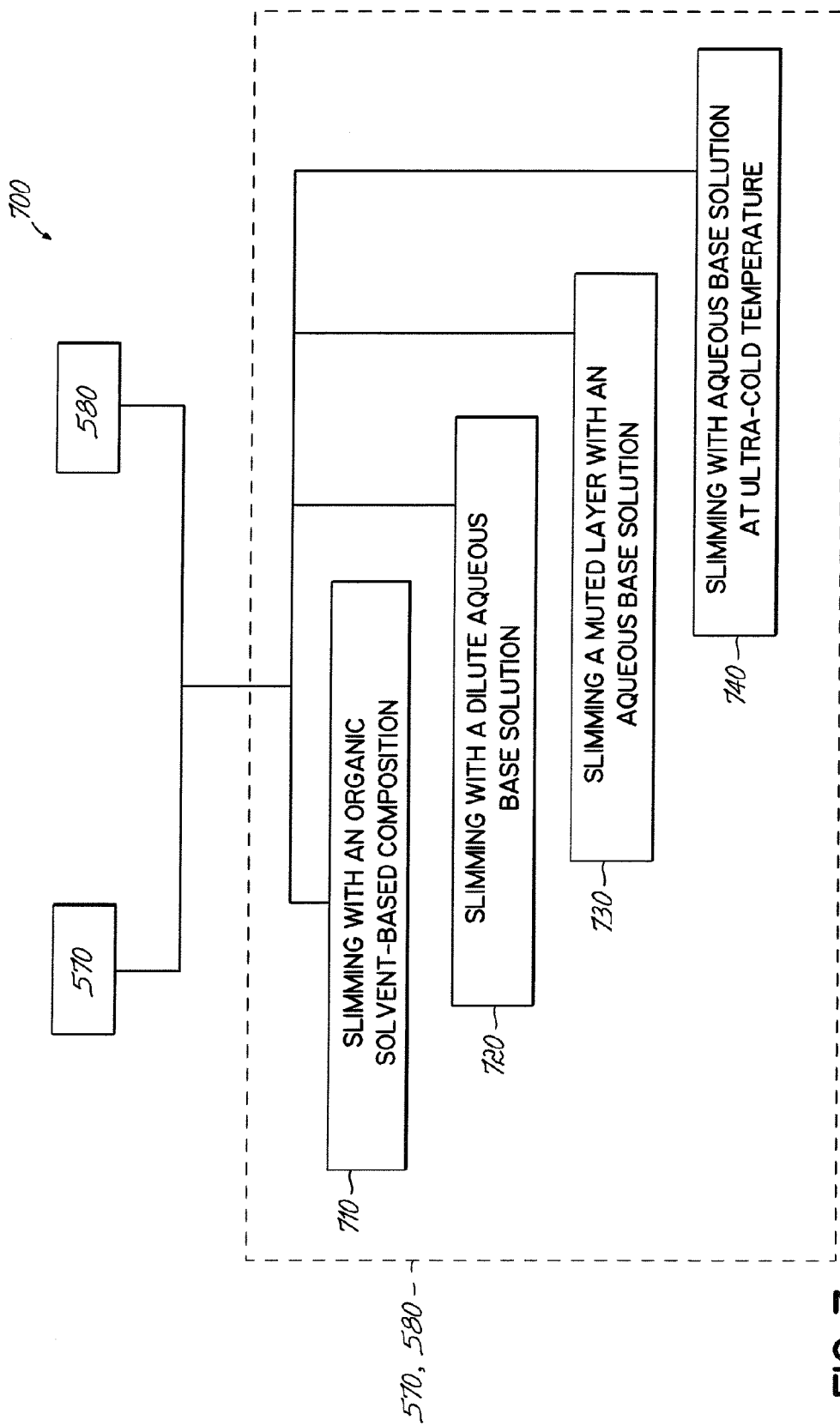
FIG. 7 illustrates a method of patterning a substrate according to another embodiment of the invention.
Figure 8:
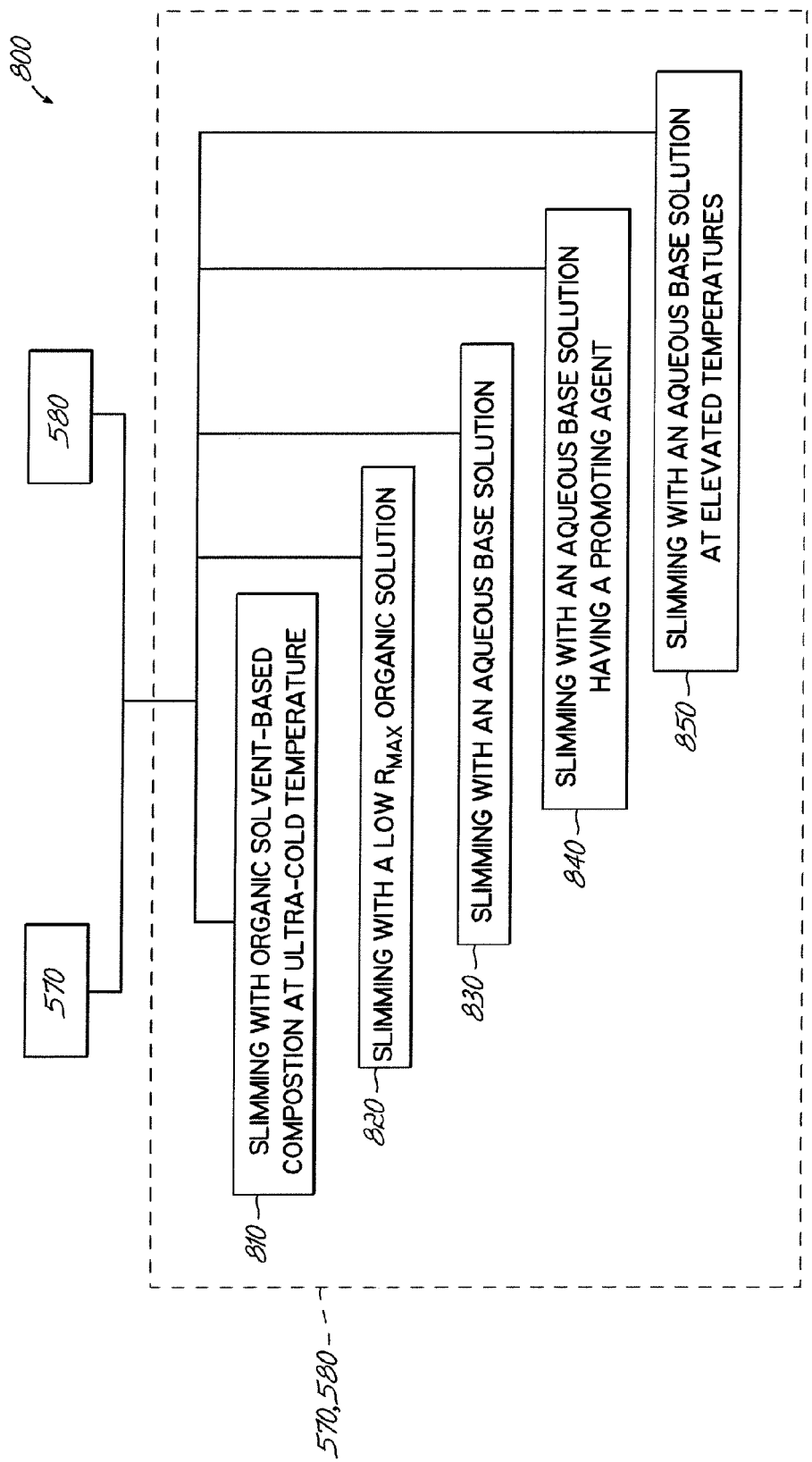
FIG. 8 illustrates a method of patterning a substrate according to yet another embodiment of the invention.

FIGS. 7 and 8 provide complementary alternative methods of slimming the fourth regions in 570 and 580 of FIGS. 5-6. According to embodiments of the invention, the slimming chemistries may be tailored or adjusted to provide isotropic dissolution rates that enable predictable and reproducible performance simply by controlling the duration of exposure to the developing chemistry. For example, developing chemistries and/or conditions may be modified to establish a dissolution rate ranging from about 0.1 nm/sec to about 5 nm/sec; about 0.2 nm/sec to about 4 nm/sec; about 0.5 to about 2 nm/sec, or about 0.1 nm/sec to about 1 nm/sec. In one example, the dissolution rate may be about 1 nm/sec.

In reference to FIG. 7, a flow chart 700 provides alternative methods of slimming radiation-sensitive material lines having approximately uniform de-protection and/or polarity. According to one embodiment, using common chemically-amplified positive resists such as a protected polyhydroxystyrene-based resists, the substantially de-protected fourth regions are relatively soluble when an aqueous base chemistry is applied, but relatively insoluble when an organic solvent-based composition chemistry is applied.

In alternative 710, the slimming may be accomplished by contacting the substantially de-protected fourth regions 430, 434 with an organic solvent-based composition. Accordingly, the organic solvent-based composition comprises an organic solvent, and may further comprise one or more other organic compounds or co-solvents, optionally water, and an optional surfactant. Thus, slimming of substantially de-protected radiation-sensitive material lines may be affected by contacting the lines with an organic solvent-based composition at an $R_{MIN}$. Optimization of the organic solvent-based composition chemistry can be readily achieved by selecting a solvent or solvent mixture to obtain the desired dissolution rate.

In alternatives 720-740, slimming may be accomplished by utilizing an aqueous base chemistry. Aqueous base chemistry, while generally selective toward highly de-protected radiation-sensitive material lines, may still be employed under modified conditions to provide a reduced slimming rate. The dissolution rate of the aqueous base chemistry may be reduced by methods, such as diluting the aqueous base chemistry solution, including a muting agent in the layer of radiation-sensitive material, or performing the aqueous base chemistry at an ultra-cold temperature. As stated above, aqueous base chemistries generally include a base, e.g., alkali, amines, etc.; water; and an optional surfactant. One exemplary base is tetramethylammonium hydroxide (TMAH).

In alternative 720, slimming may be accomplished by contacting the substantially de-protected fourth region 430, 434 with a dilute aqueous base chemistry solution. An exemplary and commercially-available aqueous base solution useful for slimming and/or developing is a 0.26N TMAH solution, which may be diluted to control the slimming rate. For example, the dissolution rate may be reduced by diluting the aqueous base chemistry by a factor of 100, 200, 500, or 1000. Accordingly, an exemplary dilute aqueous base solution includes a hydroxide salt concentration about 0.02N or less. Optimization of the diluted aqueous base chemistry can be readily achieved by selecting an appropriate dilution factor to obtain the desired dissolution rate.

In alternative 730, slimming may be accomplished by contacting the substantially de-protected fourth region 430, 434 with an aqueous base chemistry on a muted or inhibited layer of radiation-sensitive material. For example, during the formation of the film stack, a radiation-sensitive material solution may further comprise a muting agent. As such, this process makes use of an aqueous base chemistry that at high levels of de-protection develops at or near $R_{MAX}$, but the presence of the muting agent reduces the effective dissolution rate of the substantially de-protected radiation-sensitive material lines to a desired dissolution rate. One exemplary muting agent is cholic acid.

In alternative 740, the slimming may be accomplished by contacting the substantially de-protected fourth region 430, 434 with an aqueous base chemistry at an ultra-cold temperature. As used herein, ultra-cold temperature is defined as a temperature greater than the freezing point of the developing chemistry and less than room temperature. For example, the ultra-cold temperature may range from about 0° C. to about 20° C.; from about 0° C. to about 15° C.; or from about 5° C. to about 10° C.

Moreover, the foregoing slimming methods 710-740 may be combined. The slimming step may be accomplished by adjusting the composition of the organic solvent-based composition chemistry, adjusting the concentration of the aqueous base chemistry, adjusting a composition of the layer of radiation-sensitive material; adjusting the duration for applying the organic solvent-base composition or the aqueous base chemistry; adjusting the temperature of slimming chemistry, or a combination of two or more thereof.

In reference to FIG. 8, a flow chart 800 provides alternative methods of slimming radiation-sensitive material lines having approximately uniform de-protection and/or polarity.

According to one embodiment, using chemically-amplified hydrophilic polymer resists such as a protected pinacol-based resists, the radiation-sensitive material lines are substantially less polar fourth regions 430, 434 and are relatively soluble when an organic solvent-based composition chemistry is applied, but relatively insoluble when an aqueous base chemistry is applied.

In alternative 810, the slimming may be accomplished by contacting the substantially less polar fourth regions 430, 434 with an organic solvent-based composition at an ultra-cold temperature. Accordingly, the organic solvent-based composition comprises an organic solvent, and may further comprise one or more other organic compounds or co-solvents, optionally water, and an optional surfactant. As used herein, ultra-cold temperature is defined as a temperature greater than the freezing point of the organic solvent-based composition and less than 20° C. For example, the ultra-cold temperature may range from about 0° C. to about 20° C.; from about 0° C. to about 15° C.; or from about 5° C. to about 10° C.

In alternative 820, the slimming may be accomplished by contacting the substantially less polar fourth regions 430, 434 with an organic solvent-based composition having a low $R_{MAX}$. Accordingly, the organic solvent-based composition comprises an organic solvent, and may further comprise one or more other organic compounds or co-solvents, optionally water, and an optional surfactant. Thus, slimming of substantially less polar radiation-sensitive material lines may be affected by contacting the lines with an organic solvent-based composition at the low $R_{MAX}$. Optimization of the organic solvent-based composition chemistry can be readily achieved by selecting a solvent or solvent mixture to obtain the desired lower $R_{MAX}$ dissolution rate.

In alternatives 830-850, slimming may be accomplished by utilizing an aqueous base chemistry. While the substantially less polar fourth regions 430, 434 are relatively insoluble to aqueous base chemistry, the partial solubility that exists may be utilized to slim the fourth regions 430, 434.

In alternative 830, slimming may be accomplished by contacting the fourth region 430, 434 with an aqueous base chemistry solution. An exemplary and commercially-available aqueous base solution useful for slimming and/or developing is a 0.26N TMAH solution, which may be diluted to control the slimming rate. Optimization of the aqueous base concentration can be readily achieved by selecting an appropriate dilution factor to obtain the desired dissolution rate. For example, the dissolution rate may be reduced by diluting the aqueous base chemistry by a factor of 100, 200, 500, or 1000. Accordingly, an exemplary dilute aqueous base solution includes a hydroxide salt concentration about 0.02N or less.

In alternative 840, slimming may be accomplished by contacting the fourth region 430, 434 with an aqueous base chemistry having a promoting agent. Promoting agents modify the extremely polar aqueous composition to enhance the ability of the promoted aqueous base to dissolve the hydrophobic fourth regions 430, 434 at a promoted $R_{MIN}$. In other words, the promoting agent may lower the polarity of the aqueous base chemistry to enhance the effective dissolution rate of the less polar radiation-sensitive material lines to a desired dissolution rate. Other promoting agents that may enhance the effective dissolution rate of the aqueous composition include salts comprising alkali metals. Exemplary promoting agents include salts comprising lithium, sodium, potassium, rubidium or cesium.

In alternative 850, the slimming may be accomplished by contacting the substantially de-protected fourth region 430, 434 with an aqueous base chemistry at an elevated temperature. As used herein, elevated temperature is defined as a temperature greater than about 30° C. and less than about 100° C. For example, the elevated temperature may range from about 30° C. to about 80° C.; from about 35° C. to about 50° C.; or from about 30° C. to about 40° C.

Moreover, the foregoing slimming methods 810-850 may be combined. The slimming step may be accomplished by adjusting the composition of the organic solvent-based composition chemistry, adjusting the concentration of the aqueous base chemistry, adjusting a composition of the aqueous base chemistry with a promoting agent; adjusting the duration for applying the organic solvent-base composition or the aqueous base chemistry; adjusting the temperature of slimming chemistry, or a combination of two or more thereof.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

While the present invention has been illustrated by a description of one or more embodiments thereof and while these embodiments have been described in considerable detail, they are intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of patterning a substrate comprising:
    forming a layer of radiation-sensitive material on a substrate;
    exposing said layer of radiation-sensitive material to a pattern of radiation, wherein said pattern includes:
        a first region having a high radiation exposure,
        a second region having a low radiation exposure, and
        a third region having an exposure gradient ranging from about said high radiation exposure to about said low radiation exposure;
    performing a post-exposure bake following said exposing;
    performing positive-tone developing by contacting said layer of radiation-sensitive material with a first organic solvent-based composition to remove said first region from said substrate to provide a developed layer of radiation-sensitive material;
    removing said exposure gradient of said third region by transforming said second region and said third region to a fourth region having a substantially uniform level of radiation exposure, polarity, or de-protection, or a combination thereof; and
    slimming said fourth region.

2. The method of claim 1, wherein said layer of radiation-sensitive material comprises:
    a hydrophilic polymer that decreases in polarity upon performing
        said exposing and said post-exposure bake following said exposing of said layer of radiation-sensitive material,
        an acid wash and a post-acid wash bake of said layer of radiation-sensitive material, a heating of said layer of radiation-sensitive material to a temperature equal to or greater than a thermal decomposition temperature of said radiation-sensitive material, or any combination of two or more thereof; or an acid generator that provides acid-catalyzed rearrangement of the hydrophilic polymer to a more hydrophobic polymer upon performing said exposing and said post-exposure bake following said exposing of said layer of radiation-sensitive material;

said acid wash and said post-acid wash bake of said layer of radiation-sensitive material;

said heating of said layer of radiation-sensitive material to said temperature equal to or greater than said thermal decomposition temperature of said radiation-sensitive material, or any combination of two or more thereof.

3. The method of claim 1, wherein said removing said exposure gradient comprises:

performing a flood exposure and a post-flood exposure bake of said developed layer of radiation-sensitive material;

performing an acid wash and a post-acid wash bake of said developed layer of radiation-sensitive material; or heating said developed layer of radiation-sensitive material to a temperature equal to or greater than a thermal decomposition temperature of said radiation-sensitive material.

4. The method of claim 3, wherein said slimming said fourth region comprises contacting said fourth region with a second organic solvent-based composition at an ultra-cold temperature to remove a portion of said fourth region, wherein said ultra-cold temperature is less than 25° C. and greater than a freezing point of said second organic solvent-based composition.

5. The method of claim 3, wherein said slimming said fourth region comprises contacting said fourth region with a second organic solvent-based composition to remove a portion of said fourth region, wherein said second organic solvent-based composition achieves a rate of a dissolution ranging from about 0.1 nm/sec to about 5 nm/sec.

6. The method of claim 3, wherein said slimming said fourth region comprises contacting said fourth region with an aqueous base solution to remove a portion of said fourth region.

7. The method of claim 3, wherein said slimming said fourth region comprises contacting said fourth region with an aqueous solution comprising a promoting agent to remove a portion of said fourth region.

8. The method of claim 7, wherein the promoting agent is a salt comprising an alkali metal.

9. The method of claim 3, wherein said slimming said fourth region comprises contacting said fourth region with an aqueous base solution at a temperature ranging from about 30° C. to about the boiling point of the aqueous base solution.

10. A method of patterning a substrate comprising:

forming a layer of radiation-sensitive material on a substrate;

exposing said layer of radiation-sensitive material to a pattern of radiation, wherein said pattern includes:
a first region having a high radiation exposure,
a second region having a low radiation exposure, and
a third region having an exposure gradient ranging from about said high radiation exposure to about said low radiation exposure;

performing a post-exposure bake following said exposing;

performing negative-tone developing of said layer of radiation-sensitive material by contacting said layer of radiation-sensitive material with a first organic solvent-based composition to remove said second region from said substrate to provide a developed layer of radiation-sensitive material;

removing said exposure gradient of said third region by transforming said third region, and optionally said first region, to a fourth region formed from said first and said third regions having a substantially uniform level of radiation exposure, polarity, or de-protection, or a combination thereof, wherein said removing said exposure gradient comprises:

performing a flood exposure and a post-flood exposure bake of said developed layer of radiation-sensitive material;

performing an acid wash and a post-acid wash bake of said developed layer of radiation-sensitive material; or heating said developed layer of radiation-sensitive material to a temperature equal to or greater than a thermal decomposition temperature of said radiation-sensitive material; and slimming said fourth region by contacting said fourth region with a second organic solvent-based composition, wherein said layer of radiation-sensitive material comprises:
a material that increases in polarity upon performing
said exposing and said post-exposure bake following said exposing of said layer of radiation-sensitive material,
an acid wash and a post-acid wash bake of said layer of radiation-sensitive material,
a heating of said layer of radiation-sensitive material to said temperature equal to or greater than said thermal decomposition temperature of said radiation-sensitive material, or
any combination of two or more thereof; or an acid generator that generates acid upon performing
said exposing and said post-exposure bake following said exposing of said layer of radiation-sensitive material;
said acid wash and said post-acid wash bake of said layer of radiation-sensitive material;
said heating of said layer of radiation-sensitive material to said temperature equal to or greater than said thermal decomposition temperature of said radiation-sensitive material, or
any combination of two or more thereof; or a protected polymer that undergoes de-protection upon heating to a temperature equal to or greater than a thermal decomposition temperature of said protected polymer.

11. A method of patterning a substrate comprising:

forming a layer of radiation-sensitive material on a substrate;

exposing said layer of radiation-sensitive material to a pattern of radiation, wherein said pattern includes:
a first region having a high radiation exposure,
a second region having a low radiation exposure, and
a third region having an exposure gradient ranging from about said high radiation exposure to about said low radiation exposure;

performing a post-exposure bake following said exposing;

performing negative-tone developing of said layer of radiation-sensitive material by contacting said layer of radiation-sensitive material with a first aqueous base solution to remove said second region from said substrate to provide a developed layer of radiation-sensitive material;

removing said exposure gradient of said third region by transforming said third region, and optionally said first region, to a fourth region formed from said first and said third regions having a substantially uniform level of radiation exposure, polarity, or de-protection, or a combination thereof; and slimming said fourth region, wherein said layer of radiation-sensitive material comprises:
a material that decreases in polarity upon performing
said exposing and said post-exposure bake following said exposing of said layer of radiation-sensitive material,
an acid wash and a post-acid wash bake of said layer of radiation-sensitive material,
a heating of said layer of radiation-sensitive material to a temperature equal to or greater than a thermal decomposition temperature of said radiation-sensitive material, or
any combination of two or more thereof; or
an acid generator that generates acid upon performing
said exposing and said post-exposure bake following said exposing of said layer of radiation-sensitive material;
said acid wash and said post-acid wash bake of said layer of radiation-sensitive material;
said heating of said layer of radiation-sensitive material to said temperature equal to or greater than said thermal decomposition temperature of said radiation-sensitive material, or
any combination of two or more thereof; or
a protected polymer that undergoes de-protection upon heating to a temperature equal to or greater than a thermal decomposition temperature of said protected polymer.

12. The method of claim 11, wherein said removing said exposure gradient comprises:

performing a flood exposure and a post-flood exposure bake of said developed layer of radiation-sensitive material;
performing an acid wash and a post-acid wash bake of said developed layer of radiation-sensitive material; or
heating said developed layer of radiation-sensitive material to a temperature equal to or greater than said thermal decomposition temperature of said radiation-sensitive material.

13. The method of claim 12, wherein said slimming said fourth region comprises
contacting said fourth region with an organic solvent-based composition at an ultra-cold temperature to remove a portion of said fourth region, wherein said ultra-cold temperature is less than 25° C. and greater than a freezing point of said organic solvent-based composition.

14. The method of claim 12, wherein said slimming said fourth region comprises contacting said fourth region with an organic solvent-based composition to remove a portion of said fourth region, wherein said organic solvent-based composition achieves a rate of a dissolution ranging from about 0.1 nm/sec to about 5 nm/sec.

15. The method of claim 12, wherein said slimming said fourth region comprises contacting said fourth region with a second aqueous base solution to remove a portion of said fourth region.

16. The method of claim 12, wherein said slimming said fourth region comprises contacting said fourth region with a second aqueous solution comprising a promoting agent to remove a portion of said fourth region.

17. The method of claim 16, wherein the promoting agent is a salt comprising an alkali metal.

18. The method of claim 12, wherein said slimming said fourth region comprises contacting said fourth region with a second aqueous basic solution at a temperature ranging from about 30° C. to about the boiling point of the aqueous base solution.

* * * * *